(12) United States Patent
Dastgheib et al.

(10) Patent No.: US 10,756,745 B2
(45) Date of Patent: Aug. 25, 2020

(54) ELECTRICAL CIRCUIT FOR BIASING OR MEASURING CURRENT FROM A SENSOR

(71) Applicant: Verily Life Sciences LLC, South San Francisco, CA (US)

(72) Inventors: Alireza Dastgheib, Mountain View, CA (US); Johan Vanderhaegen, Cupertino, CA (US)

(73) Assignee: VERILY LIFE SCIENCES LLC, South San Francisco, CA (US)

( * ) Notice: Subject to any disclaimer, the term of this patent is extended or adjusted under 35 U.S.C. 154(b) by 296 days.

(21) Appl. No.: 15/880,806

(22) Filed: Jan. 26, 2018

(65) Prior Publication Data

US 2018/0219557 A1 Aug. 2, 2018

Related U.S. Application Data

(60) Provisional application No. 62/451,152, filed on Jan. 27, 2017.

(51) Int. Cl.
*G01N 27/327* (2006.01)
*G01N 27/416* (2006.01)
(Continued)

(52) U.S. Cl.
CPC ........ *H03M 1/124* (2013.01); *G01N 27/3274* (2013.01); *G01N 27/4163* (2013.01);
(Continued)

(58) Field of Classification Search
CPC .............................. G01N 27/3274; G05F 5/00
See application file for complete search history.

(56) References Cited

U.S. PATENT DOCUMENTS

2006/0086623 A1 4/2006 Narula et al.
2008/0251379 A1 10/2008 Mayer
(Continued)

OTHER PUBLICATIONS

Sohn et al., "A Unified Potentiostat for Electrochemical Glucose Sensors," Transactions on Electrical and Electronic Materials, vol. 14, No. 5, pp. 273-277, Oct. 25, 2013 (Year: 2013).*
(Continued)

*Primary Examiner* — Alexander S Noguerola
(74) *Attorney, Agent, or Firm* — Kilpatrick Townsend & Stockton LLP

(57) ABSTRACT

An electrical circuit can bias a sensor, measure current from a sensor, or both of these. In some examples, the electrical circuit can include a comparator having two input terminals and an output terminal. The comparator can be configured to compare input signals applied to the two input terminals and generate an output signal at the output terminal based on the comparison. The electrical circuit can include a switch having a control terminal that is electrically coupled to the output terminal of the comparator. The switch can also include a first connection terminal that is electrically coupled to the sensor and a second connection terminal that is electrically coupled to a charge-packet source. The switch can be switchable between (i) an open state to electrically decouple the sensor from the charge-packet source, and (ii) a closed state to electrically couple the sensor to the charge-packet source.

20 Claims, 4 Drawing Sheets

(51) Int. Cl.
  *H03M 1/12* (2006.01)
  *G01N 27/49* (2006.01)
  *H03K 5/24* (2006.01)
  *H03M 1/50* (2006.01)
  *G05F 5/00* (2006.01)
  *H03K 17/687* (2006.01)

(52) U.S. Cl.
  CPC ............... *G01N 27/49* (2013.01); *H03K 5/24* (2013.01); *G05F 5/00* (2013.01); *H03K 17/687* (2013.01); *H03M 1/508* (2013.01)

(56) References Cited

U.S. PATENT DOCUMENTS

| | | |
|---|---|---|
| 2013/0277216 A1 | 10/2013 | Hodges |
| 2014/0021064 A1 | 1/2014 | Pratt et al. |
| 2015/0096905 A1 | 4/2015 | Pratt et al. |
| 2015/0241375 A1 | 8/2015 | Merz et al. |

OTHER PUBLICATIONS

Ahmadi et al., "Current-Mirror-Based Potentiostat for Three-Electrode Amperometric Electrochemical Sensors," IEEE Transactions on Circuits and Systems—I: Regular Papers, vol. 56, No. 7, Jul. 2009, pp. 1339-1348 (Year: 2009).*

Goldsworthy et al, "A Digital Potentiostat," Lawrence Radiation Laboratory University of California—Berkeley publication UCRL-20486 preprint, May 1971 (Year: 1971).*

The product description of Texas Instruments LM111, LM211, LM3111 Differential Comparators, SLCS007K—Sep. 1973—Revised Mar. 2017 (Year: 2017).*

International Application No. PCT/US2018/015397, "International Search Report and Written Opinion Received", dated May 24, 2018, 9 pages.

* cited by examiner

_US 10,756,745 B2_

ELECTRICAL CIRCUIT FOR BIASING OR MEASURING CURRENT FROM A SENSOR

REFERENCE TO RELATED APPLICATION

This application claims priority to U.S. Provisional Application No. 62/451,152, filed Jan. 27, 2017 and titled "ELECTRICAL CIRCUIT FOR BIASING OR MEASURING CURRENT FROM A SENSOR", the entirety of which is hereby incorporated by reference herein.

TECHNICAL FIELD

The present disclosure generally relates to an electrical circuit for use with a sensor. More particularly, although not necessarily exclusively, this disclosure relates to an electrical circuit for biasing or measuring current from a sensor.

BACKGROUND

Various types of sensors exist for detecting various types of conditions. Examples of such sensors can include temperature sensors, electrochemical sensors, ambient light sensors, inclination sensors, acceleration sensors, velocity sensors, etc. Some sensors need to be electrically biased to operate properly or optimally. For example, an electrochemical sensor may need to have a substantially constant voltage maintained across two electrodes to operate optimally. And some sensors may output analog signals that need to be converted into digital signals for use in certain applications.

SUMMARY

One example of the present disclosure includes an electrical circuit for biasing a sensor. The electrical circuit can include a comparator having a first input terminal, a second input terminal, and an output terminal. A comparator is a circuit component that compares voltages at its input terminals and outputs a signal, at an output terminal, indicating which voltage is larger. The comparator can be configured to compare a reference voltage applied to the first input terminal to another voltage, from an electrode of the sensor, applied to the second input terminal and generate an output signal at the output terminal based on the comparison. The electrical circuit can also include a switch having a control terminal that is electrically coupled to the output terminal of the comparator, a first connection terminal that is electrically coupled to the sensor, and a second connection terminal that is electrically coupled to a charge-packet source. A charge-packet source may be an electrical component, such as a capacitor, capable of outputting a burst of electrical charge for a relatively short (e.g., on the order of microseconds) period of time. The switch can be switchable between (i) an open state to electrically decouple the sensor from the charge-packet source, and (ii) a closed state to electrically couple the sensor to the charge-packet source.

Another example of the present disclosure includes a system having the abovementioned electrical circuit and sensor.

Yet another example of the present disclosure includes a potentiostat usable with a sensor. The potentiostat can include a comparator having two input terminals and an output terminal. The comparator can be configured to compare input signals applied to the two input terminals and generate an output signal at the output terminal based on the comparison. The potentiostat can also include a switch having a control terminal that is electrically coupled to the output terminal of the comparator, a first connection terminal that is electrically coupled to the sensor, and a second connection terminal that is electrically coupled to a charge-packet source. The switch can be switchable between (i) an open state to electrically decouple the sensor from the charge-packet source, and (ii) a closed state to electrically couple the sensor to the charge-packet source. The switch can be switchable between the open state and the closed state based on at least one of a control signal from a control element or the output signal from the output terminal of the comparator. The potentiostat can also include a charge-packet source.

Still another example of the present disclosure includes a method for manufacturing an electrical circuit usable with a sensor. The method can include providing a comparator having two input terminals and an output terminal. The method can include enabling a first input terminal of the comparator to receive a reference voltage from a reference-voltage source. The method can include enabling a second input terminal of the comparator to receive an input signal from the sensor. The method can include providing a switch having two connection terminals and a control terminal. The method can include enabling a first connection terminal of the switch to electrically couple with a charge-packet source. The method can include enabling a second input terminal of the switch to electrically couple with the sensor. The method can include electrically coupling the output terminal of the comparator to the control terminal of the switch.

These illustrative examples are mentioned not to limit or define the scope of this disclosure, but rather to provide examples to aid understanding thereof. Illustrative examples are discussed in the Detailed Description, which provides further description. Advantages offered by various examples may be further understood by examining this specification.

DETAILED DESCRIPTION

Figure 1:
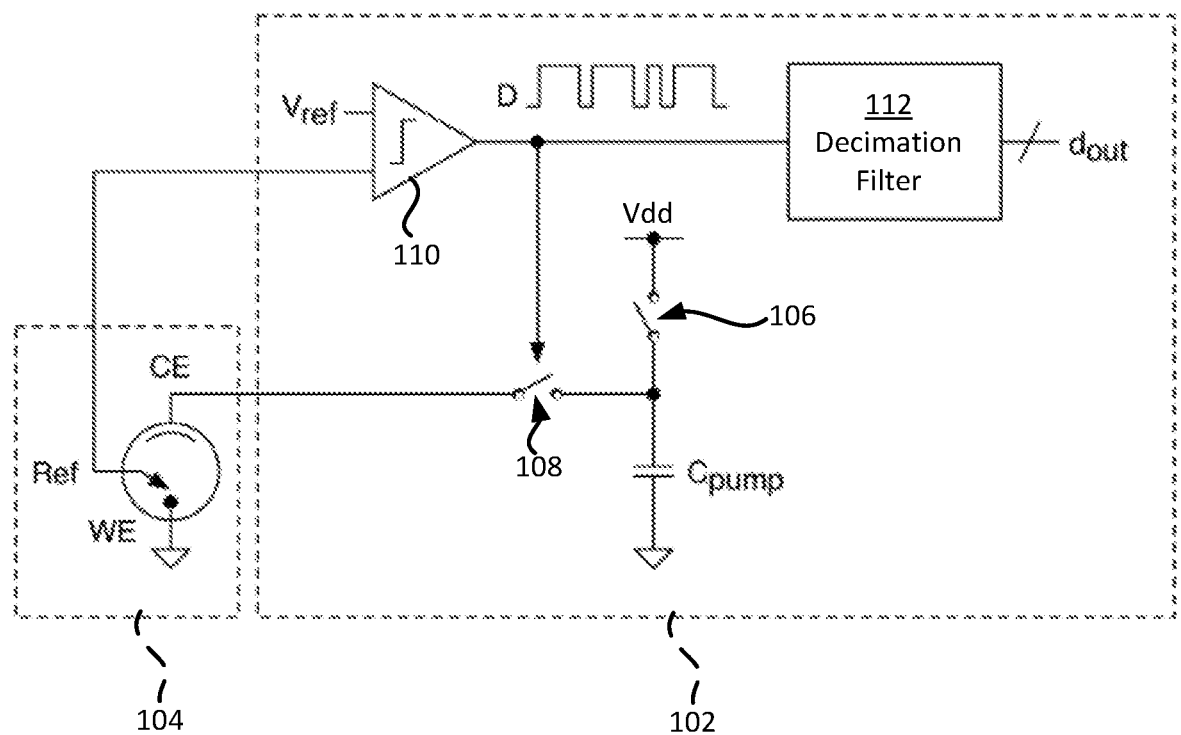
FIG. 1 is a schematic diagram of an electrical circuit for biasing or measuring current from a sensor according to some aspects of the present disclosure.

Certain aspects and examples of the present disclosure relate to an electrical circuit for biasing or measuring current from a sensor. The electrical circuit can (i) bias the sensor by maintaining the voltage across two sensor electrodes at a substantially constant level, (ii) provide an analog or digital representation of the magnitude of the sensor current, or (iii) both of these. In one example, the electrical circuit is a potentiostat for biasing or measuring current from an electrochemical sensor.

The electrical circuit includes a comparator that is electrically coupled (electrically connected, either directly or indirectly) to a terminal of the sensor. In some examples, the comparator is directly electrically coupled to the terminal of the sensor. As used herein, the phrase "directly electrically coupled" means that there are no intervening electrical components (other than a wire or trace, such as a printed-circuit-board (PCB) trace) between the comparator and the terminal of the sensor. The comparator is also electrically coupled to a voltage source that can provide a reference voltage to the comparator. The comparator can compare the voltage at the sensor terminal to the reference voltage and provide a resulting output at an output terminal.

The output terminal of the comparator can be electrically coupled to a switch. The switch can provide an electrical pathway between the sensor and a capacitor. In some examples, when the comparator determines that the voltage at the sensor terminal is less than the reference voltage, the comparator outputs a high voltage (e.g., 1 volt (V)). The high voltage causes the switch to enter a closed state, which electrically couples the sensor to the capacitor, enabling the capacitor to transmit a charge packet to the sensor. The charge packet boosts the voltage across the sensor to help maintain the voltage across the sensor at a substantially constant level (e.g., the reference-voltage level). In some examples, when the comparator determines that the voltage at the sensor terminal is greater than or equal to the reference voltage, the comparator outputs a low voltage (e.g., 0 V). The low voltage causes the switch to enter an open state, in which the capacitor is electrically decoupled from the sensor, preventing the capacitor from transmitting the charge packet to the sensor. This, in turn, may prevent the sensor from being overcharged, thereby helping to maintain the voltage across the sensor at the substantially constant level.

In some examples, the comparator outputs a pattern of digital ones and zeros that form a binary representation of (e.g., a bit stream indicating) the magnitude of the sensor current. The binary representation of the magnitude of the sensor current can be used by additional hardware or software, as needed.

Some examples of the present disclosure may consume less power than other types of circuits for biasing or measuring current from a sensor. For example, the electrical circuit may lack a closed-loop amplification stage, such as an operational transconductance amplifier (OTA) with a feedback capacitor. Such closed-loop amplification stages typically have a high loop-gain to accurately bias the sensor, which results in a high amount of power consumption. But by removing a closed-loop amplification stage for the electrical circuit, the power consumed by the circuit can be reduced. Further, some examples of the present disclosure may take up less area on a silicon die, within an FPGA, on a printed circuit board, or within a housing due to a reduced number of electrical components.

These illustrative examples are given to introduce the reader to the general subject matter discussed here and are not intended to limit the scope of the disclosed concepts. The following sections describe various additional features and examples with reference to the drawings in which like numerals indicate like elements but, like the illustrative examples, should not be used to limit the present disclosure. Further, the term "or" is not to be construed as identifying mutually exclusive options. For example, the phrase "X contains A or B" can mean that X contains A and not B, X contains B and not A, or X contains both A and B. That is, the term "or" is used to mean "and/or" unless explicitly indicated to refer to alternatives only or the alternatives are mutually exclusive.

FIG. 1 is a schematic diagram of an electrical circuit 102 for biasing or measuring current from a sensor 104 according to some aspects of the present disclosure. In this example, the sensor 104 has three electrodes—a reference electrode designated as Ref, a working electrode designated as WE, and a counter electrode designated as CE. The electrical circuit 102 can detect when a voltage between the reference electrode and the working electrode falls below a reference voltage, $V_{ref}$, and provide a charge packet from a charge-packet source (which, in this example, is capacitor $C_{pump}$) to the counter electrode. The charge packet temporarily boosts the voltage across the reference electrode and the working electrode. This may help to maintain the voltage between the reference electrode and the working electrode at a substantially constant (e.g., +/−0.1 V) level, such as at $V_{ref}$.

More specifically, the electrical circuit 102 includes a comparator 110, such as a clocked comparator or a dynamic comparator (e.g., a StrongArm comparator). A clocked comparator can provide an output on or after a transition of a clock. An input to a clocked comparator may only affect the state of the comparator for a short time interval around the transition of the clock. The speed of a clocked comparator can be relatively high as compared to other types of comparators and the power dissipation of a clocked comparator can be relatively low as compared to other types of comparators.

The comparator 110 has a first input terminal electrically coupled to the reference electrode of the sensor 104 and a second input terminal that is electrically coupled to a reference-voltage source providing the reference voltage, $V_{ref}$ (e.g., 0.5 V). An output terminal of the comparator 110 is electrically coupled to a first switch 108 that provides an electrical pathway between the capacitor $C_{pump}$ and the sensor 104. When the voltage at the reference electrode of the sensor 104 is less than $V_{ref}$, the comparator 110 outputs a first signal (e.g., a digital "1" or a digital "0") that causes the first switch 108 to close. Closure of the first switch 108 causes the capacitor $C_{pump}$ to provide a charge packet (e.g., a 1 pico-coulomb packet of charge) to the counter electrode of the sensor 104. When the voltage at the reference electrode of the sensor 104 is greater than or equal to $V_{ref}$, the comparator 110 outputs a second signal (e.g., a digital "1" or a digital "0") that causes the first switch 108 to open. This prevents the capacitor $C_{pump}$ from providing the charge packet to the counter electrode of the sensor 104.

The electrical circuit 102 also includes a second switch 106 that provides an electrical pathway between a charging-voltage source providing a charging voltage, Vdd, and the capacitor $C_{pump}$. An example of the charging voltage can be 1 V. When the first switch 108 is open, the second switch 106 can be closed to enable the capacitor $C_{pump}$ to charge up. And when the first switch 108 is closed, the second switch 106 can be opened to enable the capacitor $C_{pump}$ to provide the charge packet to the sensor 104. The switches 106, 108 can be alternately opened and closed several times while the sensor 104 is in operation to bias the sensor 104.

In some examples, the switches 106, 108 can be opened and closed according to one or more control signals provided by a control element. Examples of the control element can include a clock, such as a three-phase clock; a timer, such as a 555 timer; a microcontroller; a crystal oscillator; or any combination of these. The control signal(s) may have a predetermined frequency, such as 100 kilohertz (kHz).

Figure 2:
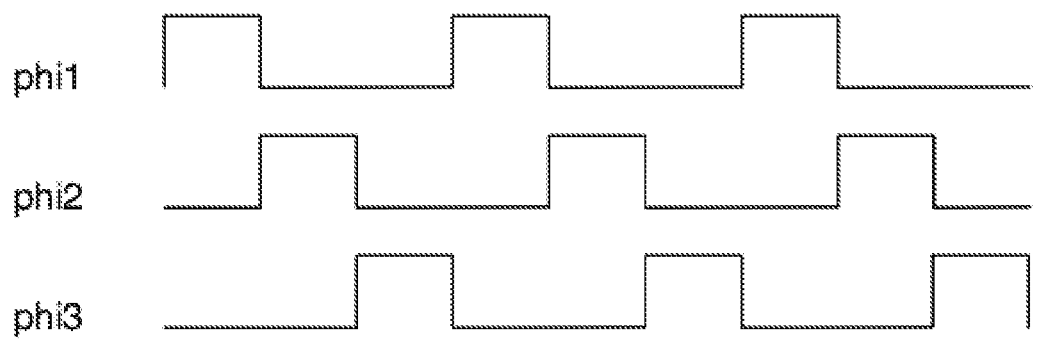
FIG. 2 is a graph of control signals for operating the electrical circuit of FIG. 1 according to some aspects of the present disclosure.

Example control signals for controlling the components of the electrical circuit 102 are shown in FIG. 2 as signals phi1, phi2, and phi3. In some examples, the control signal phi1 controls the second switch 106. For example, the second switch 106 may open when phi1 is in a high state and close when phi1 is in a low state. And, in some examples, the control signal phi2 controls the first switch 108. The control signal phi2 can control the first switch 108 alone or in combination with the output D from the comparator 110. For example, the electrical circuit 102 can include an AND gate that takes phi2 and D as inputs. Based on phi2 and D, the AND gate can provides an output that controls the first switch 108. For example, the first switch 108 may open when phi2 is in a high state and D is in a high state. The first switch 108 may close when phi2 is in a low state, D is in a low state, or both phi2 and D are in a low state. Further, in some examples, the control signal phi3 controls the comparator 110. For example, the comparator 110 may compare the voltage at a sensor terminal to the reference voltage, $V_{ref}$, at each positive edge in phi3 (or at each negative edge in phi3) and change its output accordingly. Each of the control signals (phi1, phi2, and phi3) can be out of phase from one another. For example, the control signals can be 180 degrees out of phase from one another.

In some examples, the control signal phi3 can be much narrower than phi1 and phi2. This may enable the electrical circuit 102 to operate using two control signals (phi1 and phi2) that have non-overlapping phases, instead of three control signals that have non-overlapping phases. In other examples, the switches 106, 108 can be controlled by a single control signal. For example, a single control signal can be split and sent to both a first switch (e.g., switch 106) and a NOT gate electrically coupled between the control element and a second switch (e.g., switch 108). The NOT gate can receive the control signal and provide an inverted version of the control signal to the second switch. Thus, the first switch and the second switch will receive opposite versions of the control signal, causing the first switch and the second switch to enter opposite states. Any suitable control signal(s), along with any supporting electrical component(s), can be used for operating the switches 106, 108 or the comparator 110.

Referring back to FIG. 1, in some examples, the electrical circuit 102 can provide an analog or digital representation of the current output by the sensor 104. For example, the current output by the sensor 104 can vary be between, for example, 0 nanoamps (nA) and 100 nA. As the current output by the sensor 104 changes, the comparator 110 can switch between a low state and a high state, resulting in a stream of bits (e.g., a train of pulses). An example of such a stream of bits is shown next to output D in FIG. 1. The stream of bits can represent the magnitude of the sensor current. For example, the density of the ones in the stream of bits can be proportional to the sensor current. Thus, the electrical circuit 102 may not only maintain a substantially constant voltage at the sensor 104, but may also (or alternatively) provide measurements of the sensor current. Further, in some examples, it may be desirable to convert the single-bit output (D) from the comparator 110 into a multi-bit numbered output. The electrical circuit 102 can include a decimation filter 112 for converting the single-bit output (D) from the comparator 110 into such a multi-bit numbered output (clout).

As discussed above, the sensor current may vary between a minimum current-value and a maximum current-value, such as between 0 nA and 100 nA. It may therefore be desirable to configure the electrical circuit 102 so that the electrical circuit 102 is capable of measuring current within that range. In some examples, the following equation can be used to select values for the components of the electrical circuit 102 that enable the electrical circuit 102 to measure current within a particular range:

$$I_{meas} = f_{clock} * C_{pump}(Vdd - Vref)\left(\frac{d_{out}}{\max \text{ code}}\right) + \text{nonlinearity} + I_{noise}$$

where $I_{meas}$ is the current to be measured from the sensor 104; $f_{clock}$ is the frequency of the control signals provided by the control element; $C_{pump}$ is the capacitance of the capacitor $C_{pump}$; Vdd is charge voltage Vdd; Vref is the reference voltage $V_{ref}$; dout is the output $d_{out}$; and max code is the maximum value for the output $d_{out}$, which can be equal to $2^B-1$, where B is the number of bits output by the decimation filter 112 (e.g., max code is 1023 for a 10-bit decimation filter). Also, nonlinearity is a static non-linearity due to the non-ideality of the electrical circuit 102, and may exist due to imperfect charge distribution, charge leakage, an imperfect reference voltage $V_{ref}$, or an imperfect or noisy comparator 110. $I_{noise}$ is an additive noise term that may also be due to the non-ideality of the electrical circuit 102, and may exist for any of the abovementioned reasons. For example, the maximum amount of current ($I_{max}$) that the electrical circuit 102 can measure can be determined by setting dout equal to max code in the above equation, which then reduces to:

$$I_{max} = f_{clock} * C_{pump}(Vdd-Vref) + \text{nonlinearity} + I_{noise}$$

If the maximum sensor-current measurable by the electrical circuit 102 is to be 100 nA, and both the nonlinearity and $I_{noise}$ are zero, then the equation further reduces to:

$$100 \text{ nA} = f_{clock} * C_{pump}(Vdd-Vref)$$

The variables in the above equation can then be selected to satisfy the equation. For example, $f_{clock}$ can be 100 kHz, $C_{pump}$ can be 2 pF, Vdd can be 1 V, and Vref can be 0.5 V, which results in an $I_{max}$ of 100 nA.

Some examples of the present disclosure can include more or different components having the same or different values as those described above. And some examples of the present disclosure include different arrangements of the components described above. For example, although in FIG. 1 the comparator 110 and the first switch 108 are electrically coupled to the reference electrode and the counter electrode, respectively, in other examples the comparator 110 or the first switch 108 can be electrically coupled to different electrodes or a different configuration of the electrodes. In one particular example, the reference electrode and the counter electrode can be the same electrode, and the sensor 104 can have two other electrodes, so that the sensor 104 has at least three total electrodes. In such an example, both the comparator 110 and the first switch 108 can be electrically coupled to the combined reference/counter electrode. Further, although the sensor 104 shown in FIG. 1 has three electrodes, in other examples the sensor 104 can include a different number and configuration of electrodes. For example, the sensor 104 can have two electrodes. In one such example, the reference electrode and the counter electrode can be the same electrode, so that the sensor 104 has two total electrodes.

Figure 3:
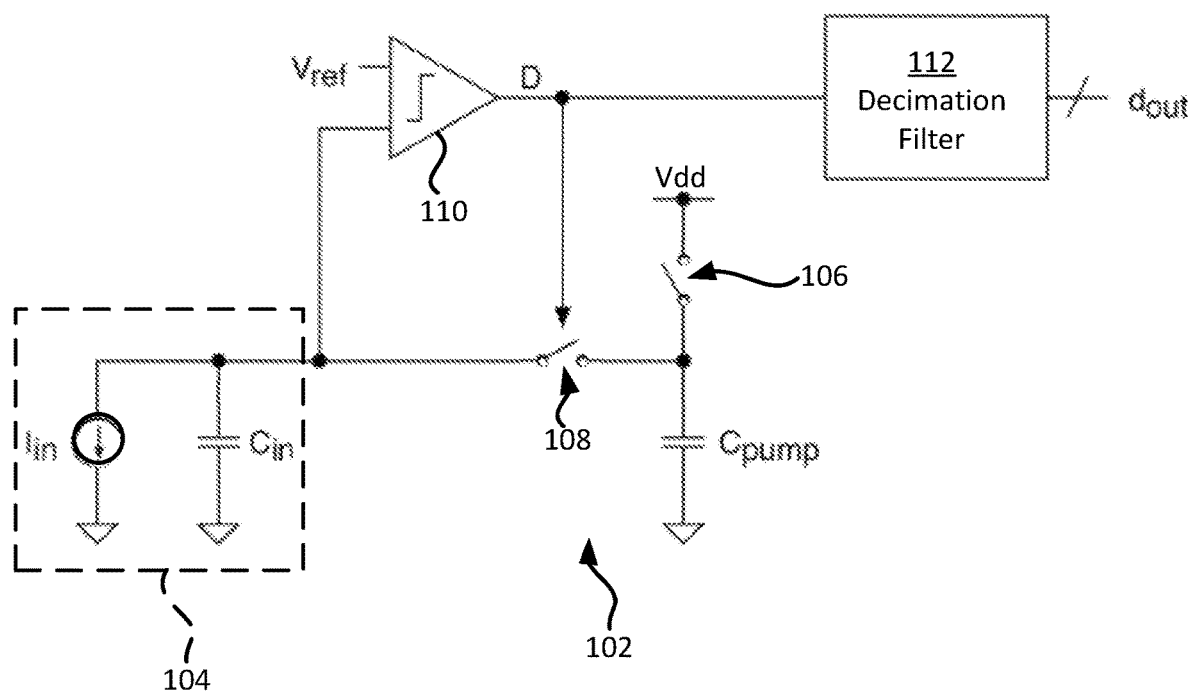
FIG. 3 is a schematic diagram of the electrical circuit of FIG. 1 electrically coupled to a sensor that is represented as a current source in parallel with a capacitor according to some aspects of the present disclosure.

Further, in some examples the sensor 104 has an internal capacitance. For example, referring now to FIG. 3, the sensor 104 can be represented as a current source ($I_{in}$) that is electrically coupled in parallel to an internal capacitor, $C_{in}$. $C_{in}$ can have a capacitance of, for example, 100 nanofarads. The internal capacitor $C_{in}$ can form at least a portion of an integration stage (e.g., an open-loop integrator), eliminating the need to include a separate integration stage (e.g., often implemented as a closed-loop gain stage that acts as an integrator) in the electrical circuit 102. This may reduce the power consumed by the electrical circuit 102. In other examples in which the sensor 104 lacks a suitable internal capacitance to form the integration stage, a capacitor can be electrically coupled in parallel with the sensor 104 to form the integration stage.

Figure 4:
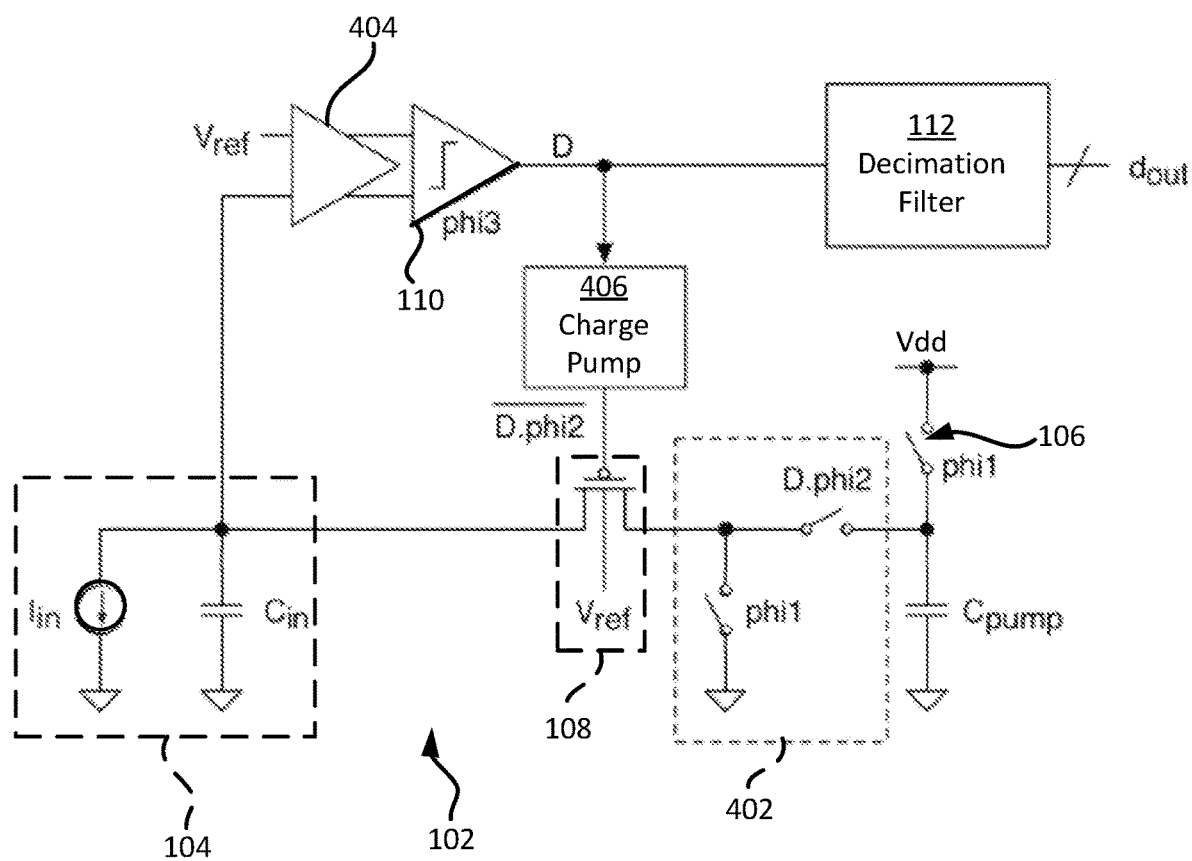
FIG. 4 is a schematic diagram of the electrical circuit of FIG. 3 in which additional details are included according to some aspects of the present disclosure.

Turning now to FIG. 4, in some examples the electrical circuit 102 includes an amplifier 404 (e.g., an open-loop amplifier) electrically coupled between the comparator 110 and the sensor 104. The amplifier 404 can increase the overall resolution of the comparator 110 and reduce the offset of the comparator 110.

In some examples, such as the example shown in FIG. 4, the switches 106, 108 can include transistors. For example, the switch 108 is represented in FIG. 4 by a transistor having a substrate (or "body") terminal that is electrically coupled to the reference voltage, $V_{ref}$. A gate terminal of the transistor can be electrically coupled to a charge pump 406. The other two terminals (the source and drain terminals) of the transistor can be electrically coupled between the capacitor $C_{pump}$ and the sensor 104.

The charge pump 406 can include switches, transistors, capacitors, or any combination of these. In some examples, the charge pump 406 can adjust the level of the gate of the transistor of the switch 108 to maximize its off/on resistance. For example, the charge pump 406 can convert an input voltage (e.g., a digital input voltage) that is between 0 V and 1 V to an output voltage between −1 V and +1 V. The transistor connected to the charge pump 406 may have a lower on-resistance when −1 V is applied to the gate, so the transistor may conduct better and have a smaller on-resistance as a result of the charge pump 406. Conversely, the off resistance of the transistor may be high enough that the charge pump 406 may not affect the off resistance of the transistor when the charge pump applies +1 V to the gate of the transistor.

In some examples, for the transistor of switch 108 to operate properly, the voltage at the substrate terminal ($V_{ref}$) must be higher than the voltage at the source and drain terminals. For instance, if the transistor is a P-type metal-oxide-semiconductor (PMOS) transistor, the substrate terminal voltage must be higher than the voltage at the source and drain terminals in order to operate properly. To ensure that $V_{ref}$ is higher than the voltage at the source and drain terminals, one or more additional switches 402 can be electrically coupled between the transistor of the switch 108 and the capacitor $C_{pump}$. The switches 402 can isolate the capacitor $C_{pump}$ from the transistor of the switch 108. Isolating the capacitor $C_{pump}$ from the switch 108 can prevent the capacitor $C_{pump}$ from forward biasing the transistor when $C_{pump}$ is charged up to Vdd (which can be greater than $V_{ref}$), causing the transistor to operate improperly. As shown in FIG. 4, the switches 402 can be operated by control signals phi1 and phi2, respectively, in some examples.

The switches 106, 108, 402 can include any number and combination of transistors (e.g., PMOS transistors, n-type metal-oxide-semiconductor (NMOS) transistors, complimentary metal-oxide-semiconductor (CMOS) transistors, etc.), mechanical switches, micro-electromechanical system (MEMS) switches, or other suitable switching components. For example, switch 106 can include a PMOS transistor, switch 108 can include a PMOS transistor, the vertical switch of switches 402 can include an NMOS transistor, and the horizontal switch of switches 402 can include a CMOS transistor. Thus, the particular implementations of the switches 106, 108, 402 shown in the figures are not intended to be limiting.

Figure 5:
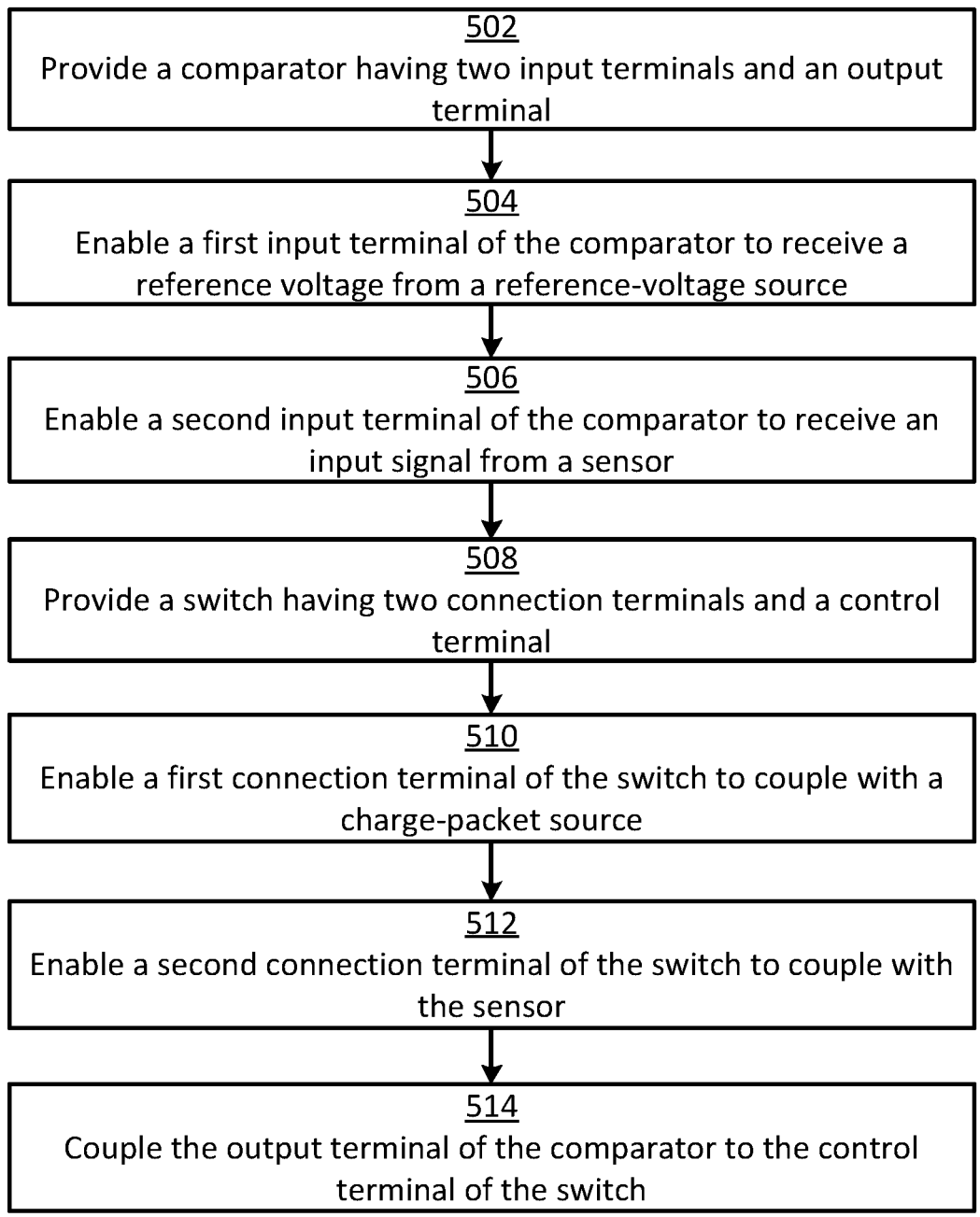
FIG. 5 is a flow chart of an example of a process for manufacturing an electrical circuit usable for biasing or measuring current from a sensor according to some aspects.

FIG. 5 is a flow chart of an example of a process for manufacturing an electrical circuit 102 usable for biasing or measuring current from a sensor according to some aspects. Some examples can include more, fewer, or different steps than the steps depicted in FIG. 5. For simplicity, the steps of FIG. 5 are described with reference to components described above with regard to FIG. 1, but other implementations are possible.

In block 502, a manufacturer of the electrical circuit 102 provides a comparator 110 having two input terminals and an output terminal. In some examples, the manufacturer of the electrical circuit 102 can receive the comparator 110 from a distributor (e.g., by purchasing the comparator 110 from the distributor). In other examples, the manufacturer of the electrical circuit 102 can create the comparator 110. For instance, the manufacturer of the electrical circuit 102 can configure one or more transistors or other circuit components into an arrangement that functions as the comparator 110. In some examples, the manufacturer can program a comparator into an FPGA or form a switch 108 on a silicon die as a part of an ASIC.

In block 504, the manufacturer of the electrical circuit 102 enables a first input terminal of the comparator 110 to receive a reference voltage ($V_{ref}$) from a reference-voltage source. For example, the manufacturer can electrically couple the first input terminal of the comparator 110 to the reference-voltage source. As another example, the manufacturer can attach a connector to the first input terminal of the comparator 110 that enables the first input terminal to electrically couple with the reference-voltage source. As still another example, the manufacturer can solder or otherwise attach the first input terminal of the comparator 110 onto a PCB or other substrate, which may have a lead or wire extending from the first input terminal of the comparator 110 to the reference-voltage source (or a connector for the reference-voltage source).

In block 506, the manufacturer of the electrical circuit 102 enables a second input terminal of the comparator 110 to receive an input signal from a sensor 104. For example, the manufacturer can electrically couple the second input terminal of the comparator 110 to the sensor. As another example, the manufacturer can attach a connector to the second input terminal of the comparator 110 that enables the second input terminal to electrically couple with the sensor 104. As still another example, the manufacturer can solder or otherwise attach the second input terminal of the comparator 110 onto a PCB or other substrate, which may have a lead or wire extending from the second input terminal of the comparator 110 to the sensor 104 (or a connector for the sensor 104).

In block 508, a manufacturer of the electrical circuit 102 provides a switch 108 having two connection terminals and a control terminal. In some examples, the manufacturer of the electrical circuit 102 can receive the switch 108 from a distributor (e.g., by purchasing the switch 108 from the distributor). In other examples, the manufacturer of the electrical circuit 102 can create the switch 108. For instance, the manufacturer of the electrical circuit 102 can configure one or more transistors or other circuit components into an arrangement that functions as the switch 108. In some examples, the manufacturer can program a switch 108 into an FPGA or form a switch 108 on a silicon die as a part of an ASIC.

In block 510, the manufacturer of the electrical circuit 102 enables a first connection terminal of the switch 108 to electrically couple with a charge-packet source (e.g., $C_{pump}$). For example, the manufacturer can electrically couple the first connection terminal of the switch 108 to the charge-packet source. As another example, the manufacturer can attach a connector to the first connection terminal of the switch 108 that enables the first connection terminal to electrically couple with the charge-packet source. As still another example, the manufacturer can solder or otherwise attach the first connection terminal of the switch 108 onto a PCB or other substrate, which may have a lead or wire extending from the first connection terminal of the switch 108 to the charge-packet source (or a connector for the charge-packet source).

In block 512, the manufacturer of the electrical circuit 102 enables a second connection terminal of the switch 108 to electrically couple with the sensor 104. For example, the manufacturer can electrically couple the second connection terminal of the switch 108 to the sensor 104. As another example, the manufacturer can attach a connector to the second connection terminal of the switch 108 that enables the second connection terminal to electrically couple with the sensor 104. As still another example, the manufacturer can solder or otherwise attach the second connection terminal of the switch 108 onto a PCB or other substrate, which may have a lead or wire extending from the second connection terminal of the switch 108 to the sensor 104 (or a connector for the sensor 104).

In block 514, the manufacturer of the electrical circuit 102 electrically couples the output terminal of the comparator 110 of the control terminal of the switch 108. For example, the manufacturer can solder or otherwise attach the output terminal of the comparator 110 onto a PCB or other substrate, which may have a lead or wire extending from the output terminal of the comparator 110 to the control terminal of the switch 108.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

The invention claimed is:

1. An electrical circuit for biasing a sensor, the electrical circuit comprising:
   a comparator having a first input terminal, a second input terminal, and an output terminal, the comparator being configured to compare (i) a reference voltage applied to the first input terminal to (ii) another voltage applied to the second input terminal from an electrode of the sensor and generate an output signal at the output terminal based on the comparison; and
   a switch having a control terminal that is electrically coupled to the output terminal of the comparator, a first connection terminal that is electrically coupled to the sensor, and a second connection terminal that is electrically coupled to a charge-packet source, the switch being switchable between (i) an open state to electrically decouple the sensor from the charge-packet source, and (ii) a closed state to electrically couple the sensor to the charge-packet source.

2. The electrical circuit of claim 1, wherein the switch is switchable between the open state and the closed state based on at least one of a control signal from a control element or the output signal from the output terminal of the comparator.

3. The electrical circuit of claim 2, wherein:
   the sensor to be used with the electrical circuit comprises a three-terminal electrochemical sensor having a reference electrode, a working electrode, and a counter electrode;
   the other voltage that is to be applied to the second input terminal of the comparator is a voltage across the reference electrode and the working electrode of the sensor;
   the first connection terminal of the switch is electrically coupled to the counter electrode of the sensor and the second input terminal of the comparator is electrically coupled to the reference electrode of the sensor;
   the charge-packet source is a capacitor;
   the switch is a transistor; and
   the control element is a clock.

4. The electrical circuit of claim 1, further comprising:
   an open-loop amplifier electrically coupled between the comparator and the sensor; and
   a decimation filter electrically coupled to the output terminal of the comparator and configured to convert a single bit output from the comparator into a multi-bit output.

5. The electrical circuit of claim 1, wherein the switch is a first switch, the open state is a first open state, and the closed state is a first closed state, and further comprising:
   a second switch coupled between the charge-packet source and a charging-voltage source, the second switch being switchable between (i) a second open state to electrically decouple the charge-packet source from the charging-voltage source, and (ii) a second closed state to electrically couple the charge-packet source to the charging-voltage source, the second switch being switchable between the second open state and the second closed state based on a control signal from a control element.

6. The electrical circuit of claim 1, wherein the electrical circuit lacks a closed-loop amplifier and the comparator is directly coupled to the sensor.

7. The electrical circuit of claim 1, further comprising a capacitor configured to be coupled in parallel with the sensor when the electrical circuit is coupled to the sensor.

8. The electrical circuit of claim 1, further comprising the sensor.

9. A potentiostat usable with a sensor, the potentiostat comprising:
   a comparator having two input terminals and an output terminal, the comparator being configured to compare input signals applied to the two input terminals and generate an output signal at the output terminal based on the comparison;
   a switch having a control terminal that is electrically coupled to the output terminal of the comparator, a first connection terminal that is electrically coupled to the sensor, and a second connection terminal that is electrically coupled to a charge-packet source, the switch being switchable between (i) an open state to electrically decouple the sensor from the charge-packet source, and (ii) a closed state to electrically couple the sensor to the charge-packet source, the switch being switchable between the open state and the closed state based on at least one of a control signal from a control element or the output signal from the output terminal of the comparator; and the charge-packet source.

10. The potentiostat of claim 9, wherein the sensor is an electrochemical sensor.

11. The potentiostat of claim 9, wherein:
a first connection terminal of the switch is electrically coupled to a counter electrode of the sensor and a second input terminal of the comparator is electrically coupled to a reference electrode of the sensor;
the charge-packet source is a capacitor; and
the switch is a transistor.

12. The potentiostat of claim 11, wherein the sensor to be used with the potentiostat comprises a three-terminal electrochemical sensor having the reference electrode, a working electrode, and the counter electrode.

13. The potentiostat of claim 9, further comprising a decimation filter electrically coupled to the output terminal of the comparator and configured to convert a single bit output from the comparator into a multi-bit output.

14. The potentiostat of claim 9, wherein the switch is a first switch, the open state is a first open state, the closed state is a first closed state, and the control signal is a first control signal, and further comprising:
a second switch coupled between the charge-packet source and a charging-voltage source, the second switch being switchable between (i) a second open state to electrically decouple the charge-packet source from the charging-voltage source, and (ii) a second closed state to electrically couple the charge-packet source to the charging-voltage source, the second switch being switchable between the second open state and the second closed state based on a second control signal.

15. The potentiostat of claim 14, wherein the switch is controlled using a first control signal, the second switch is controlled using the second control signal, and the comparator is controlled using a third control signal.

16. The potentiostat of claim 9, wherein the potentiostat lacks a closed-loop amplifier and the comparator is directly coupled to the sensor.

17. The potentiostat of claim 9, further comprising a capacitor configured to be coupled in parallel with the sensor when the sensor is coupled to the potentiostat.

18. The potentiostat of claim 9, further comprising an open-loop amplifier configured to be electrically coupled between the comparator and the sensor when the sensor is coupled to the potentiostat.

19. A method for manufacturing an electrical circuit usable with a sensor, the method comprising:
providing a comparator having two input terminals and an output terminal;
enabling a first input terminal of the comparator to receive a reference voltage from a reference-voltage source;
enabling a second input terminal of the comparator to receive an input signal from the sensor;
providing a charge-packet source;
providing a switch having two connection terminals and a control terminal;
electrically coupling a first connection terminal of the switch to the charge-packet source;
enabling a second input terminal of the switch to electrically couple with the sensor; and
electrically coupling the output terminal of the comparator to the control terminal of the switch.

20. The method of claim 19, wherein the switch is switchable between (i) an open state to electrically decouple the sensor from the charge-packet source, and (ii) a closed state to electrically couple the sensor to the charge-packet source.

* * * * *